United States Patent
Noori

(10) Patent No.: US 6,922,552 B2
(45) Date of Patent: Jul. 26, 2005

(54) LINEARIZATION METHOD AND SIGNAL PROCESSING DEVICE

(75) Inventor: Basim Noori, Folsom, CA (US)

(73) Assignee: Nokia Corporation, Espoo (FI)

( * ) Notice: Subject to any disclaimer, the term of this patent is extended or adjusted under 35 U.S.C. 154(b) by 539 days.

(21) Appl. No.: 10/191,395

(22) Filed: Jun. 11, 2002

(65) Prior Publication Data

US 2003/0071684 A1 Apr. 17, 2003

Related U.S. Application Data

(63) Continuation of application No. PCT/EP99/10095, filed on Dec. 17, 1999.

(51) Int. Cl.[7] .................................... H04B 1/04
(52) U.S. Cl. ...................... 455/114.3; 455/114.1; 455/114.2; 375/296; 375/297; 330/149
(58) Field of Search .................... 455/114.1, 114.2, 455/114.3, 126, 127.1; 375/296, 297; 330/149, 124 R, 151, 136

(56) References Cited

U.S. PATENT DOCUMENTS

| | | | |
|---|---|---|---|
| 5,172,072 A | | 12/1992 | Willems et al. ............. 330/149 |
| 5,455,538 A | | 10/1995 | Kobayashi et al. .......... 330/149 |
| 5,966,400 A | * | 10/1999 | Den Braber ................. 375/327 |
| 6,285,859 B1 | * | 9/2001 | Fernandez Duran et al. .... 455/63.1 |
| 6,437,644 B1 | * | 8/2002 | Kenington ................... 330/149 |

FOREIGN PATENT DOCUMENTS

| | | | | |
|---|---|---|---|---|
| WO | 9625791 | | 8/1996 | |
| WO | WO 96/25791 | * | 8/1996 | .............. H03F/1/32 |

* cited by examiner

*Primary Examiner*—Lee Nguyen
*Assistant Examiner*—Sanh Phu

(57) ABSTRACT

The present invention relates to a linearisation method and signal processing device for reducing intermodulation distortions by extracting harmonic components generated from first and second carrier signals with different carrier frequencies, which are input into two first non-linear stages (11, 12). The harmonic components may be generated by the two first non-linear stages (11, 12) or by two additional harmonic generating elements (NE1, NE2). The extracted harmonic components are phase and/or amplitude adjusted and mixed with harmonic components generated in a second non-linear stage (4) to thereby reduce harmonic components so as to achieve a linear output waveform. Thus, an intermodulation distortion suppression can be achieved over the entire operating bandwidth, wherein no phase coherency of the two carrier signals is required.

23 Claims, 6 Drawing Sheets

LINEARIZATION METHOD AND SIGNAL PROCESSING DEVICE

CROSS-REFERENCE TO RELATED APPLICATION

This application is a continuation of International Application PCT/EP99/10095, having an international filing date of Dec. 17, 1999 and from which priority is claimed under all applicable sections of Title 35 of the United States Code, including, but not limited to, Sections 120, 363 and 365(c).

FIELD OF THE INVENTION

The present invention relates to a method for linearising a signal processing device having two first non-linear stages and a second non-linear stage for processing a first carrier signal and a second carrier signal having different carrier frequencies which may be intended for two-tone power amplifications in a wireless communication system, such as the GSM (Global System for Mobile communications) system.

BACKGROUND OF THE INVENTION

In wireless or mobile communication systems, e.g., TDMA or CDMA based systems, multi carrier transmission schemes are used in which signals are transmitted using multiple carriers with different frequencies. This may serve to mitigate the effect of frequency-selective fading that appears for a case of high data rate transmission. However, if such multi carrier signals are passed through non-linear elements or stages of devices, distortions due to intermodulation between the two carrier signals occur. These distortions are caused by harmonic frequency components (intermodulation frequencies) generated by the non-linear characteristic of the element or stage. In particular, intermodulation distortion (IMD) products consist of higher order harmonics, e.g., IMD 3 (Intermodulation distortion third order) products caused by second harmonic components (having twice the value of the fundamental carrier frequency) and IMD 5 (intermodulation distortion fifth order) products caused by second and third harmonic components (i.e., having twice and triple the value of the fundamental carrier frequency).

FIG. 1 shows a frequency spectrum at the output of a non-linear stage such as a power amplifier of the GSM system, wherein a two-tone signal consisting of two carrier frequencies fo1 and fo2 is amplified by respective amplifiers. As can be gathered from FIG. 1, the intermodulation distortions due to the non-linear characteristics of the amplifier lead to additional harmonic components at the frequencies fo1−Δf and fo2+Δf (IMD 3 products), and at the frequencies fo1−2Δf and fo2+2Δf (IMD 5 products), wherein Δf denotes the frequency offset between the two carrier frequencies.

Therefore, a linearisation of the characteristics of such non-linear elements or stages is required in order to suppress the undesired IMD products (especially the major IMD 3products which mainly result from a third order non-linearity of the characteristics). Such a linearisation may be achieved by linearising the characteristic curve of the respective non-linear element to thereby reduce the third or fifth order intermodulation products.

Furthermore, it has been suggested to suppress the IMD products by sub-banding the operating bandwidth, such that the carrier frequencies are individually processed. However, in this case, a full bandwidth operation is not possible. Moreover, a phase coherency is required, wherein an extra carrier signal, typically the carrier of the Broadcast Control CHannel (BCCH) of the GSM system was required to achieve phase synchronization.

SUMMARY OF THE INVENTION

It is therefore an object of the present invention to provide a linearisation method and a signal processing device, by means of which a suppression of IMD products can be achieved over the entire operating bandwidth without requiring a phase coherency between the carrier signals.

This object is achieved by a method for linearising a signal processing device having two first non-linear stages and a second non-linear stage, said method comprising the steps of:

inputting a first carrier signal and a second carrier signal into the two first non-linear stages separately, the first and second carrier signals having different carrier frequencies;

extracting harmonic components generated from the first and second carrier signals;

controlling the phase and/or amplitude of the extracted harmonic components; and reducing harmonic components at the output of the second non-linear stage by combining the phase and/or amplitude controlled harmonic components with harmonic components of the first and second carrier signals, generated in the second non-linear stage.

Additionally the above object is achieved by a signal processing device for processing a first carrier signal and a second carrier signal having different carrier frequencies, the device comprising:

two first non-linear stages to which the first and second carrier signals are input separately;

harmonic extracting means for extracting harmonic components generated from the first and second carrier signals;

controlling means for individually controlling the phase and/or amplitude of the extracted harmonic components; and combining means for combining the phase and/or amplitude controlled harmonic components with harmonic components of a second non-linear stage, so as to reduce harmonic components at the output of the signal processing device.

Accordingly, harmonic components are extracted from the first and second carrier signals which are separately input to the two first non-linear stages. The extracted harmonic components are phase and/or amplitude controlled and are added to the harmonic components generated at the second non-linear stage, so as to suppress the total harmonic components generated at the output of the device. This novel harmonic injection linearisation technique (HILT) is capable of suppressing third order intermodulation products by more than 30 dB over the entire 900 MHz operating bandwidth and with amplitude and phase imbalance, while phase coherency is not required due to the separate processing in the two first non-linear stages.

The extraction of the harmonic components at the first non-linear stages enables an individual IMD control for each harmonic component. Due to this individual or frequency-selective IMD control, phase shifters and attenuators used for the IMD control do not require flat frequency response characteristics.

The extracting step may be performed by individual filtering operations for each harmonic component. In particular, the output signals of the first non-linear stages may be split into a main and a coupled path, wherein a lowpass filtering operation for filtering the fundamental frequencies is performed in the main path and a bandpass filtering operation for filtering the harmonic components is performed in the coupled path. Thus, the harmonic components are processed individually in the coupled path so as to be mixed or added with the same order components generated by the second nonlinear stage, to thereby produce a linear output waveform. The harmonic components and/or the fundamental components may be processed as individual paths by separate phase and amplitude conditioning (e.g., adjusting or controlling) networks. The phase control (in the coupled path) may be performed by a phase shifting operation, and the amplitude control (in the coupled path) may be performed by an attenuation operation.

The harmonic components may be generated in the two first non-linear stages. Alternatively, the harmonic components may be generated by additional harmonic generating devices such as diodes or ferrites. The latter case is advantageous in cases where the harmonic components generated in the first stages are too small to be used for the control, as in the core of CDMA (Code Division Multiple Access) or EDGE (Enhanced Data rates over GSM Evolution) systems where the amplifier stages operate "backed-off" i.e. in the linear region. I If the harmonic components are generated by the additional harmonic generating devices, these devices may be arranged in the coupled path, wherein the fundamental frequency components are also supplied to the coupled path.

Preferably, the combining step may comprise mixing the phase and/or amplitude controlled harmonic components with fundamental frequency components at the input of the second non-linear stage. Alternatively, the combining step may comprise mixing the phase and/or amplitude controlled harmonic components with the output signal of the second non-linear stage.

The phase and/or amplitude controlling step may be individually performed for each one of the extracted harmonic components, wherein the extracted harmonic components are combined and amplified before the combining step. In particular, the harmonic components may comprise second and/or third harmonic components. Thus, in case only a IMD 3 suppression is required, the harmonic injection linearisation technique may be performed solely on the basis of the second harmonic components causing the IMD 3 products.

The coupled path for processing the extracted harmonic components may comprise one path for each extracted harmonic component. Each of the coupled paths may comprise a variable phase shifter and a variable attenuator. Thereby, the phase and amplitude of each harmonic component may be controlled individually in such a manner that an extinction between the extracted harmonic components and those harmonic components generated in the second non-linear stage is achieved upon the subsequent combination thereof.

Furthermore, second combining means may be provided for combining an extracted harmonic component of the first carrier signal with an extracted harmonic component of the second carrier signal, and third combining means may be provided for combining an extracted fundamental frequency component of the first carrier signal with an extracted fundamental frequency component of the second carrier signal, wherein the combined fundamental frequency components are supplied to the second non-linear stage. Thus, each of the harmonic and fundamental frequency components of the two carrier signals is individually processed and subsequently combined, wherein the fundamental frequency components are supplied to the second non-linear stage, and the combined harmonic components are combined with the output signal of the second non-linear stage so as to suppress the harmonic components generated from the combined fundamental frequency components at the second non-linear stage.

The two first non-linear stages may be arranged as a balanced driver configuration and the second non-linear stage may a power-amplifier. Thus, harmonic components of the first and second carrier signals are individually generated in the respective driver stage of the balanced driver configuration.

BRIEF DESCRIPTION OF THE DRAWINGS

In the following, the present invention will be described in greater detail on the basis of a preferred embodiment with a reference to the accompanying drawings, in which.

DESCRIPTION OF THE PREFERRED EMBODIMENT

In the following, the preferred embodiment of the method and signal processing device according to the present invention will described on the basis of a two-tone power amplifier of the GSM-System.

Figure 1:
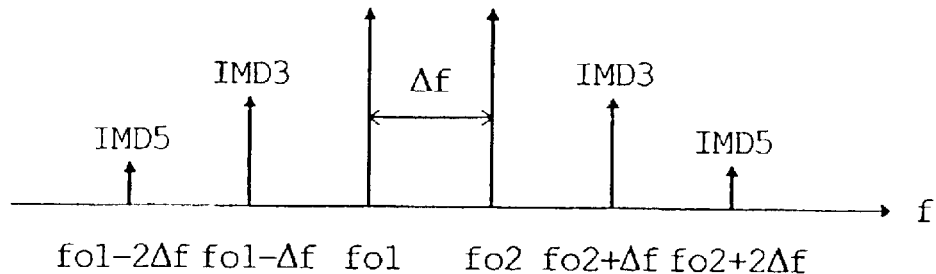
FIG. 1 shows a frequency spectrum at the output of a non-linear element or stage at the input of which a dual-tone signal is applied.
Figure 2:
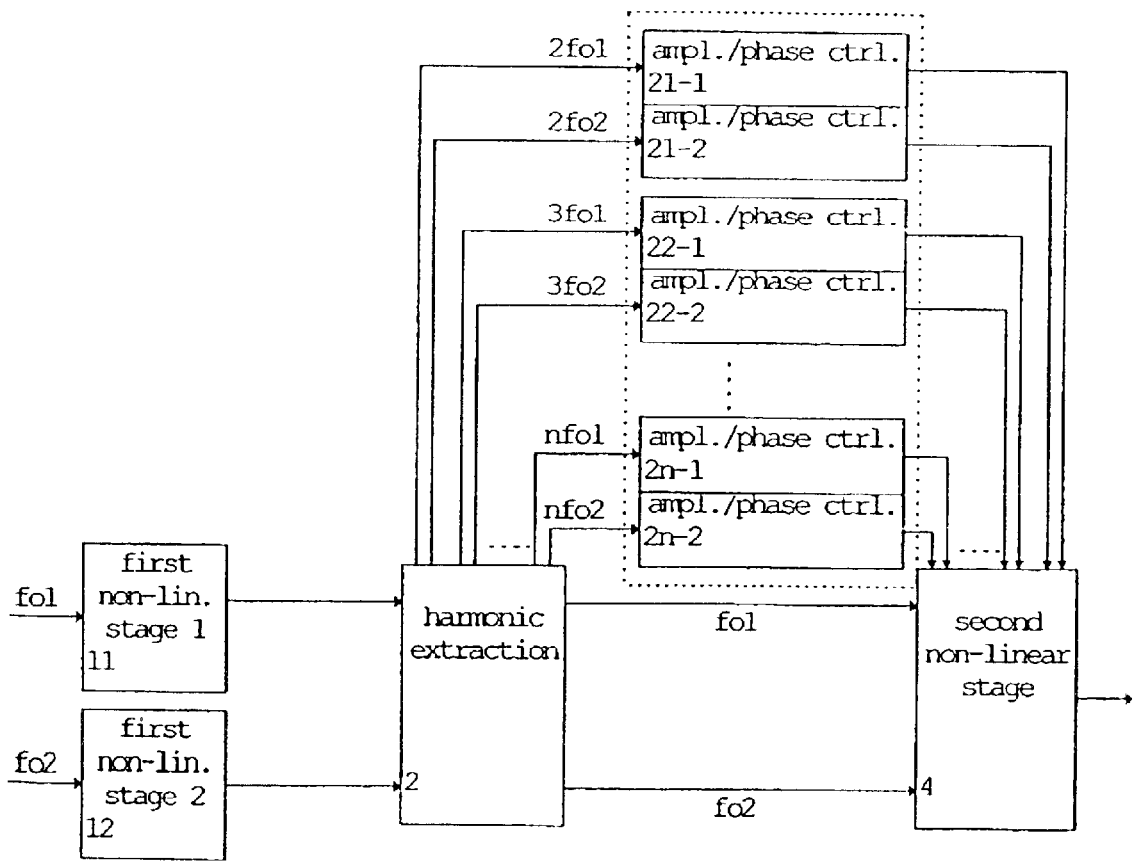
FIG. 2 shows a basic functional block-diagram of the concept underlying the preferred embodiment of the present invention.

FIG. 2 shows a functional block diagram of the basic concept underlying the preferred embodiment of the present invention. According to FIG. 1, a dual tone signal comprising carrier frequencies fo1 and fo2 which are separately supplied to two first non-linear stages 11 and 12 which may constitute a balanced driver configuration or any other non-linear configuration of the power-amplifier. At the output of the first non-linear stages 11 and 12, the fundamental frequency and the harmonic components 2fo1 to nfo1 relating to the carrier frequency fo1 and the fundamental frequency fo2 and the harmonic components 2fo2 to nfo2 relating to the second carrier frequency fo2 are supplied to a harmonic extraction unit 2 arranged to extract each order pair of harmonic components consisting of the same order harmonic components of the first and second carrier signals, i.e., the second harmonic components (2fo1, 2fo2), the third harmonic components (3fo1, 3fo2), and so on until the nth harmonic components (nfo1, nfo2), wherein n denotes the maximum order required to achieve a desired degree of linearisation. The order pairs of the harmonic components are supplied to respective separate amplitude and phase control units 21-1, 21-2, 22-1, 22-2 to 2n-1, 2n-2 in which the phase and/or amplitude of the harmonic components are individually controlled or adjusted so as to achieve adjusted harmonic components suitable for suppressing the harmonic components generated in a second non-linear stage 4 which may be a final power amplifier stage or any other non-linear stage of the dual-tone power amplifier.

Alternatively, the harmonic components may be generated in the harmonic extraction unit 2. In this case, the harmonic extraction unit 2 may comprise two additional harmonic generating elements, e.g., non-linear elements such as diodes or ferrites, for each of the first and second carrier signals, wherein the fundamental frequency components fo1 and fo2 of the first and second carrier signals are extracted, e.g., by a filter operation, and separately supplied to the harmonic generating elements which are arranged to generate the required harmonic components.

At the input of the second non-linear stage 4, the fundamental frequency components fo1 and fo2 of the two carrier signals are applied from the harmonic extraction unit 2.

Thus, as can be gathered from FIG. 2, the basic concept underlying the preferred embodiment is to use two first non-linear stages or two additional harmonic generating elements to generate predetermined harmonic components which are controlled and utilized in such a way as to mix or combine them with the same order components generated by the second non-linear stage 4 to thereby produce a linear output waveform. This is achieved on the basis of the following equations:

$$vi = a1 \cdot \cos(\omega 1 \cdot t) + a2 \cdot \cos(\omega 2 \cdot t) \tag{1}$$

wherein vi denotes the dual tone signal (e.g. value of momentary voltage), a1 the amplitude and $\omega 1$ the angular frequency of the first carrier signal, a2 the amplitude and $\omega 2$ the angular frequency of the second carrier signal, and t a time variable.

The non-linear characteristic curves of the first and second non-linear stages 1 and 4 can be approximated by using the following power series expansion:

$$i0 = k1 \cdot vi + k2 \cdot vi^2 + k3 \cdot vi^3 + k4 \cdot vi^4 + k5 \cdot vi^5 \tag{2}$$

wherein i0 denotes the momentary output value (e.g., value of the momentary output current), and k1 to k5 predetermined parameters specifying the characteristic curve of the respective non-linear stage.

A combination of the above two equations (1) and (2) leads to the classical equation indicating all frequency components generated due to the approximated non-linearity. For reasons of simplicity, only those terms relating to the IMD3 and IMD5 products are indicated in the following:

IMD3 products:
Third order terms:

$$k3 \cdot a1^2 \cdot a2 \cdot (3/4) \cdot \cos(t \cdot (2\omega 1 - \omega 2))$$

$$k3 \cdot a1 \cdot a2^2 \cdot (3/4) \cdot \cos(t \cdot (\omega 1 - 2\omega 2))$$

Fifth order terms:

$$k5 \cdot a1^2 \cdot a2^3 \cdot (15/8) \cdot \cos(t \cdot (2\omega 1 - \omega 2))$$

$$k5 \cdot a1^3 \cdot a2^2 \cdot (15/8) \cdot \cos(t \cdot ((\omega 1 - 2\omega 2))$$

$$k5 \cdot a1^4 \cdot a2 \cdot (5/4) \cdot \cos(t \cdot (2\omega 1 - \omega 2))$$

$$k5 \cdot a1 \cdot a2^4 \cdot (5/4) \cdot \cos(t \cdot (\omega 1 - 2\omega 2))$$

IMD5 products:

$$k5 \cdot a1^2 a2^3 \cdot (5/8) \cdot \cos(t \cdot (2\omega 1 - 2\omega 2))$$

$$k5 \cdot a1^3 \cdot a2^2 \cdot (5/8) \cdot \cos(t \cdot (3\omega 1 - 2\omega 2))$$

As can be gathered from the above equations, the IMD3 products lead to the spectral lines at the frequencies fo1−$\Delta$f and fo2+$\Delta$f and the IMD5 products lead to spectral lines at fo1−2$\Delta$f and fo2+2$\Delta$f, wherein
$\Delta f = fo2 - fo1$, $\omega 1 = 2\pi \cdot fo1$ and $\omega 2 = 2\pi \cdot fo2$.

Hence, by controlling or adjusting the second and third order harmonic components ($2\omega 1$, $2\omega 2$, $3\omega 1$, $3\omega 2$) an elimination or reduction of IMD3 and IMD5 can be achieved.

Although it appears at first instance that an elimination of IMD5 may as well be achieved by using only second order harmonic components, this is not strictly true as the known Volterra series shows that the transconductance of the devices have also phase dependencies. Therefore, depending on the amplitude of the IMD5 products a configuration comprising third order harmonic parts is required.

Thus, both IMD3 and IMD5 products can be suppressed or eliminated by using at least the upper two amplitude and phase control units 21 and 22 shown in FIG. 2.

The extraction of the harmonic components in the harmonic extraction unit 2 may be based on filter operations, frequency-dependent coupling operations, or the like. The amplitude and phase control in the amplitude and phase control units 21-1, 21-2 to 2n-1, 2n-2 may be achieved on the basis of variable phase shifters or delay lines and variable attenuation elements such as variable resistors or other attenuation elements.

The combining of the controlled harmonic components at the second non-linear stage 4 may be achieved by a coupling or mixing operation performed at the input or the output of the second non-linear stage, such that the controlled harmonic components are added to or mixed with the harmonic components generated in the second non-linear stage 4 in order to achieve a suppression of the harmonic components at the output of the second non-linear stage 4.

Figure 3:
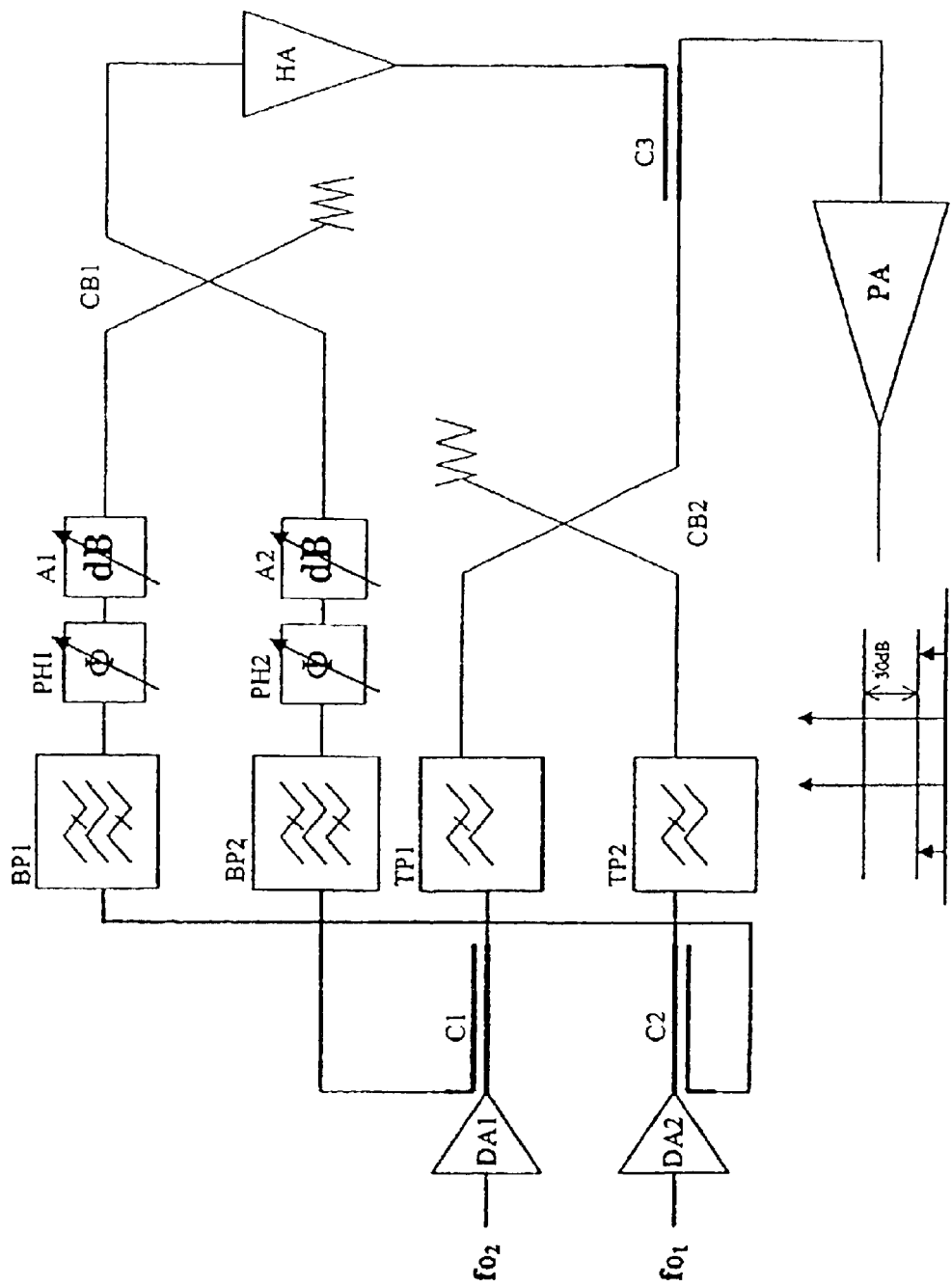
FIG. 3 shows a basic block diagram of a second or third harmonic injection linearisation technique where the mixing of fundamental frequency components and phase and/or amplitude adjusted harmonic components is done prior to a power amplifier as a first example of the preferred embodiment.

In the following, a first example of the preferred embodiment will be described with reference to FIG. 3. The first example relates to a two-tone power amplifier comprising a balanced driver configuration, i.e., dual driver stages DA1 and DA2, to which the carrier frequencies fo1 and fo2 are supplied. The power amplifier works by splitting the output of the driver stages DA1 and DA2 using respective branching elements C1 and C2 into four paths, namely two main and two coupled paths. The branching elements C1 and C2 may be electrical couplers or other coupling or branching devices suitable for the desired frequency range. In the main paths, the output signals of the driver stages DA1 and DA2 are passed through respective lowpass filters TP1 and TP2 designed to filter out all frequency components above the fundamental frequency. Then, the filtered fundamental frequencies, i.e., carrier frequencies fo1 and fo2, are combined or mixed in a combining element CB2 which may be a high frequency mixing device with a dummy load (e.g., energy absorbing resistor) at one of its outputs, as shown in FIG. 3.

The coupled paths are inter-stage second or third harmonic line-ups consisting of respective bandpass filters BP1 and BP2 designed to filter out the second harmonic component of the respective carrier signals. Furthermore, the coupled paths comprise respective variable phase shifters PH1 and PH2, respective variable attenuators A1 and A2, a combining element CB1 such as a branch-line coupler having a dummy load at one output thereof, and a linear harmonic amplifier HA. The bandpass filters BP1 and BP2 are tuned across the operating or frequency band of the second harmonic, which is double that of the fundamental frequency but has the same fractional bandwidth. The variable phase shifters PH1 and PH2 and the variable attenuators A1 and A2 can be controlled so as to adjust or control the phase and/or amplitude of the second harmonic components which are than combined in the combining element CB1, and amplified in the linear harmonic amplifier HA.

The output of the inter-stage linear amplifier HA is mixed with the fundamental frequency components at the output of the combined main paths, by using a coupling element C3, similar to the above coupling elements C1 and C3. The two sets of frequency components obtained from the main paths and the coupled paths constitute the signal at the input of a final stage amplifier (power amplifier) PA. Thus, the input signal comprises the fundamental components from the driver amplifiers DA1 and DA2 and the other phase shifted and/or amplified second harmonic components of the driver amplifiers DA1 and DA2. This input signal is mixed with the internally generated second harmonic components of the final stage amplifier PA to produce a resultant linear waveform with a theoretical elimination of IMD3 products. Experimental measurements at a practical implementation of the preferred embodiment indicated an IMD3 suppression of at least 30 dB.

The same concept may be used to eliminate IMD5 products by utilising the third harmonic components (i.e., triple frequency values) in the coupled path instead of the second harmonic components. Furthermore, both second and third harmonic components may be used together to eliminate IMD3 products and IMD5 products simultaneously, as described later with reference to FIG. 6.

The preferred embodiment described above, where two first stages in parallel are used, leads to the advantage that no frequency dependency has to be considered in the control, since the harmonic components are controlled in individual harmonic paths. Thus, the full operating bandwidth of the GSM-system can be used. Moreover, due to the individual processing of the fundamental frequency components in the balanced driver configuration, the device shows independence from phase imbalance and amplitude imbalance. Accordingly, the device is capable of handling amplitude imbalance as in a typical constantly changing power level environment, e.g., at the GSM Base Transceiver Station (BTS).

Furthermore, an individual control of the IMD products can be achieved by the individual control paths, which leads to a simple envelope detection circuitry for phase and amplitude adjustment.

The device is capable of handling two coherent or non-coherent GSM carriers without and with linearisation, respectively. The mode of modulation can be PRBS9.

Figure 4:
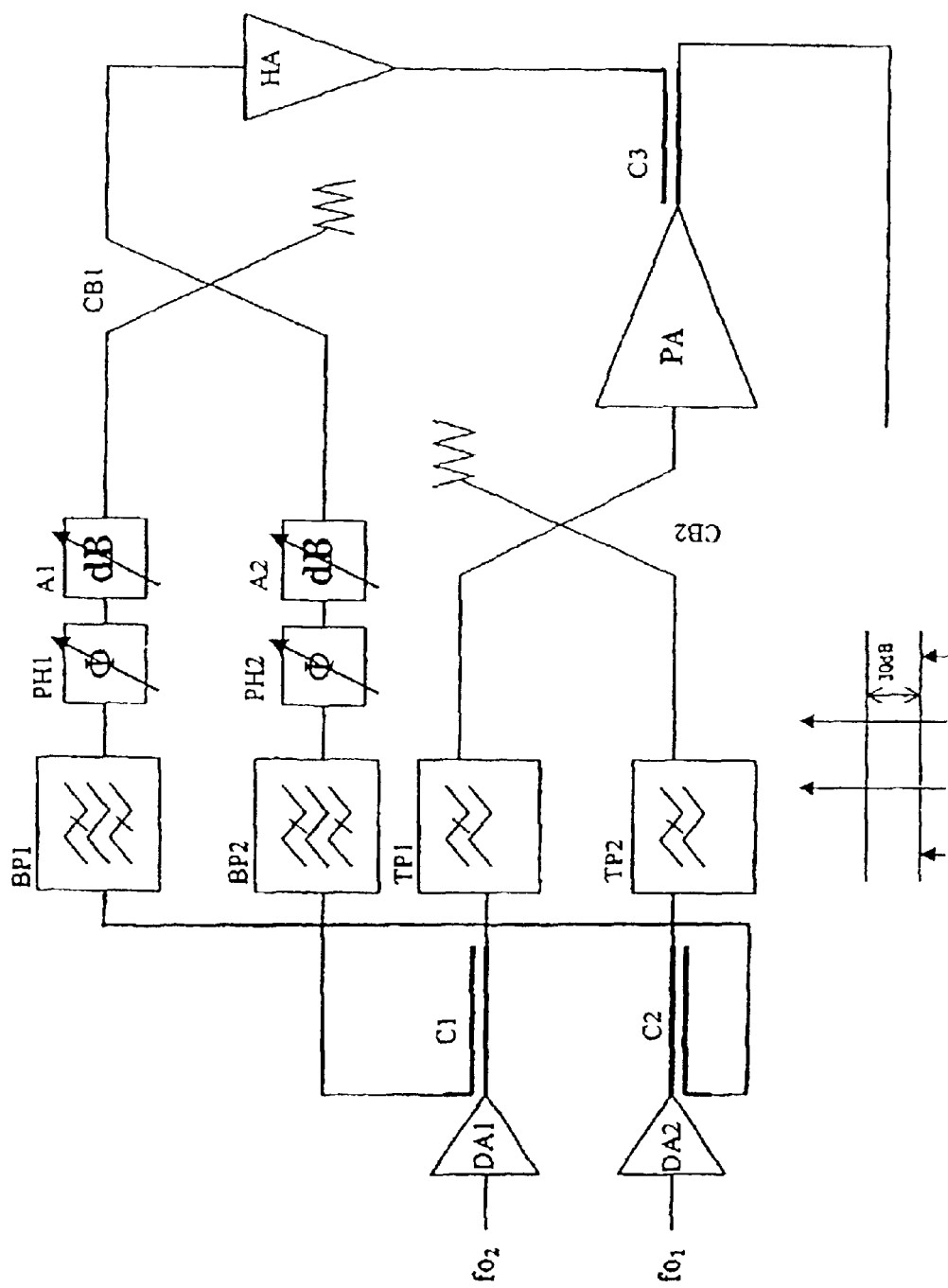
FIG. 4 shows a basic block diagram of a modification of the first example, wherein the mixing of the fundamental and the phase and amplitude adjusted harmonic component is done after the power amplifier, as second example of the preferred embodiment.

FIG. 4 shows a basic block diagram of a second example as a modification of the first example of the preferred embodiment. According to FIG. 4, the mixing or combining of the fundamental frequency components with the phase and amplitude adjusted harmonic components is done after the final stage amplifier PA. Thus, the respective coupling element C3 is arranged at the output of the final stage amplifier PA. In this case, the harmonic components generated in the final stage amplifier PA are supplied to the coupling element C3 where they are mixed or combined with the combined and amplified phase and/or amplitude adjusted harmonic components of the driver amplifiers DA1 and DA2 so as to suppress the non-desired harmonic components in the output signal.

Figure 5:
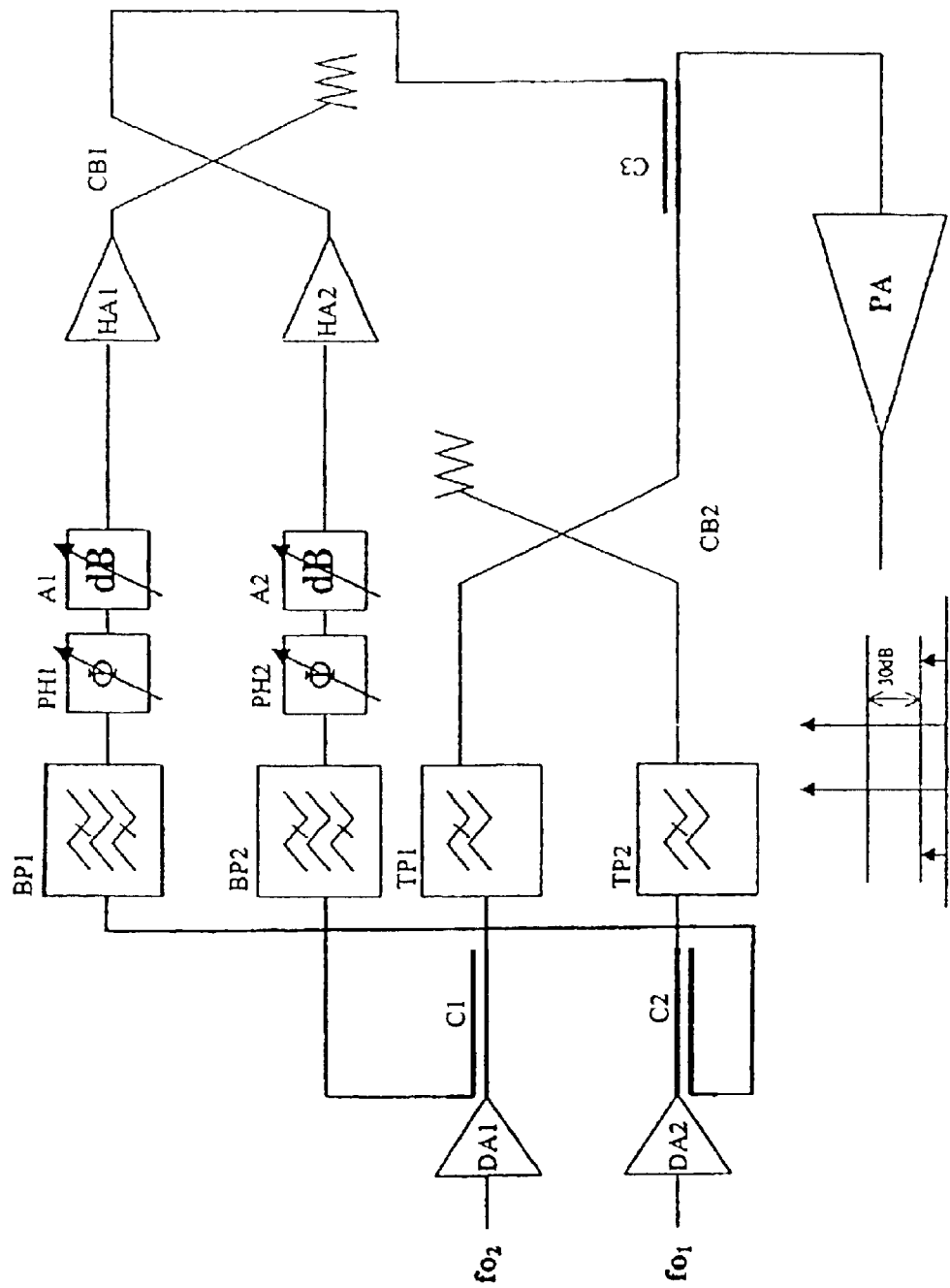
FIG. 5 shows a basic block diagram of a modification of the first example, wherein two harmonic amplifiers are used before combining the respective harmonic components, as a third example of the preferred embodiment.

FIG. 5 shows a third example as a modification of the first example of the preferred embodiment, wherein the linear harmonic amplifier HA at the output of the combining element CB1 has been replaced by respective linear harmonic amplifiers HA1 and HA2 arranged in the respective coupled paths of the harmonic components. Thereby, an individual amplification of the extracted harmonic components can be achieved.

Figure 6:
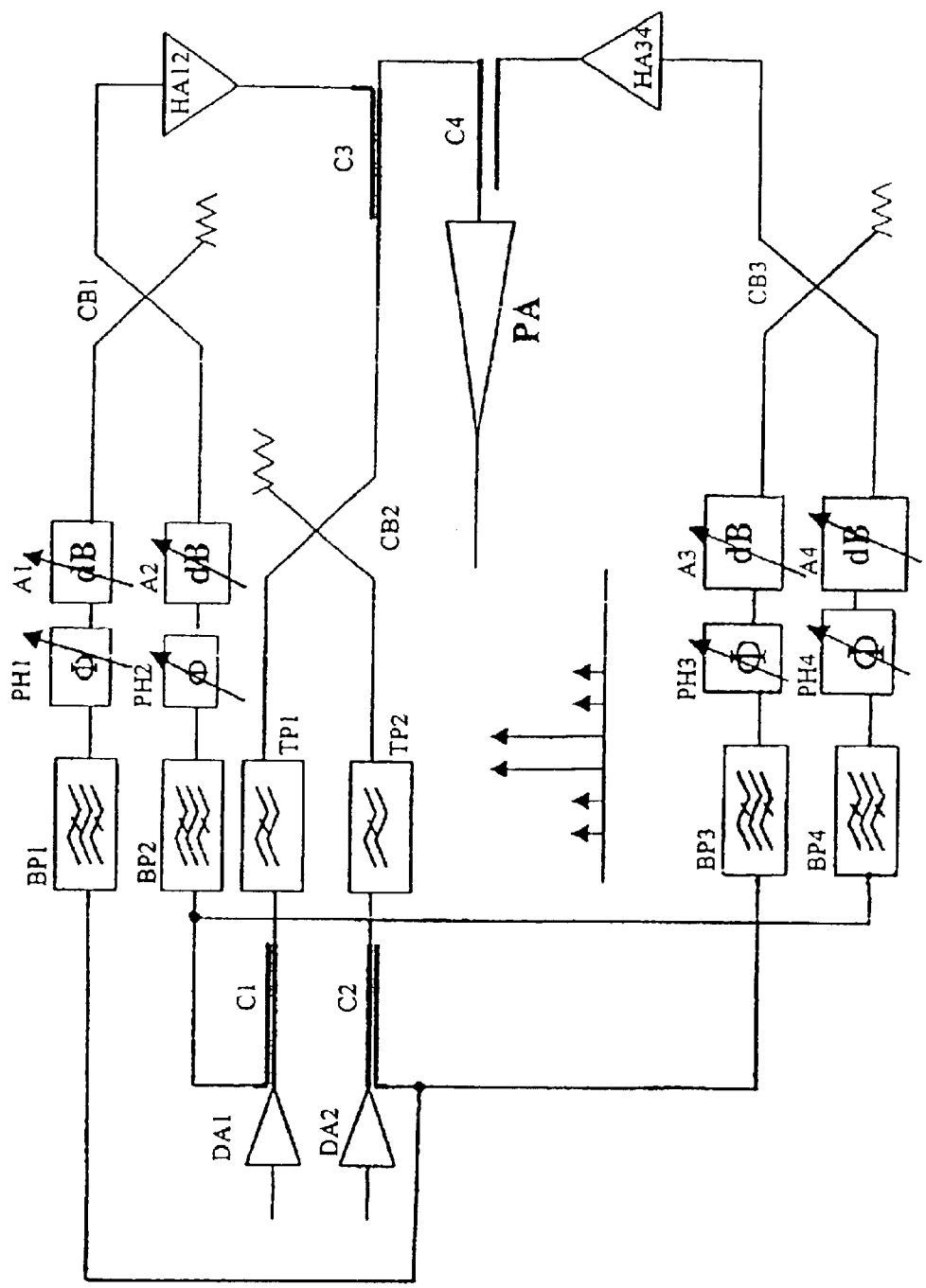
FIG. 6 shows a basic block diagram of a hybrid configuration of the harmonic injection linearisation technique, wherein both second and third harmonic components are used to suppress IMD3 and IMD5 products, respectively, as a fourth example of the preferred embodiment.

Finally, FIG. 6 shows a fourth example relating to a hybrid configuration of the two-tone power amplifier, capable of suppressing IMD3 and IMD5 products by extracting and controlling second and third order harmonic components. The fourth example is based on a duplication of the arrangement of the first example shown in FIG. 3. The upper part of the basic block diagram shown in FIG. 6 relates to the extraction and phase and/or amplitude adjustment of the second order harmonic components, wherein those components corresponding to the first example shown in FIG. 3 are denoted by the same reference numerals.

In addition to the first example, the present fourth example comprises additional coupled paths connected to the respective coupled paths of the second harmonic components. However, in the additional coupled paths, bandpass filters BP3 and BP4 are provided for filtering out the respective third harmonic components (3fo1 and 3fo2, respectively), and variable phase shifters PH3 and PH4 and variable attenuators A3 and A4 are provided for use in the respective higher frequency range. The extracted third order harmonic components are then combined in a combining element CB3 similar to the combining elements CB1 and CB2, and the combined third order harmonic components are amplified in a linear harmonic amplifier HA3. The amplified and combined phase and/or amplitude adjusted third order harmonic components are supplied to a coupling element C4 arranged behind the coupling elements C3 and connected to the input of the final stage amplifier PA. Thus, the amplitude and/or phase adjusted second order harmonic components and the amplitude and/or phase adjusted third order harmonic components are mixed or combined with the combined fundamental frequencies obtained from the combining element CB2, and supplied to the final stage amplifier PA where they are mixed with the second and third order harmonic components generated in the final stage amplifier PA. Accordingly, both second and third order harmonic components can be suppressed at the output of the fourth example of the preferred embodiment.

Figure 7:
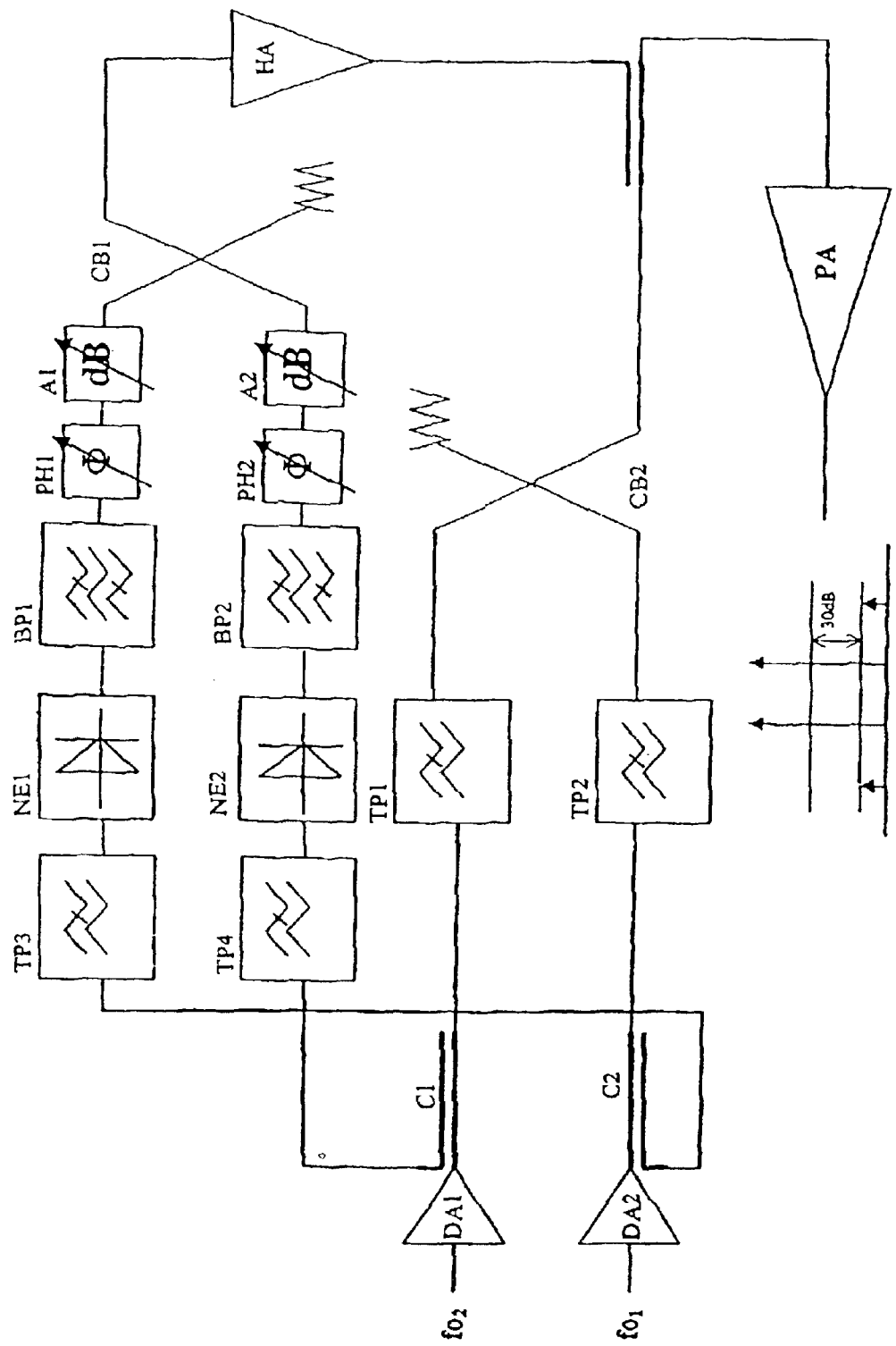
FIG. 7 shows a basic block diagram of a modification of the first example, wherein the harmonic components are generated by additional non-linear elements, as a fifth example of the preferred embodiment.

FIG. 7 shows a modification of the first example, wherein the harmonic components (e.g., 2fo1 and 2fo2, or 3fo1 and 3fo2) of the carrier frequencies fo1 and fo2 are generated in the driver stages DA1 and DA2 but in two additional harmonic generating elements NE1 and NE2 which may comprise non-linear elements such as diodes or ferrites. In particular, the harmonic generating elements NE1 and NE2 may comprise antiparallel diodes suitable to generate odd harmonic components, or a quad or bridge diode arrangement suitable to generate even harmonic components.

Since the harmonic components generated in the driver stages DA1 and DA2 are thus no longer required for the harmonic extraction operation, they are filtered in the respective coupled paths by respective low pass filters TP3 and TP4 adapted to filter out only the fundamental frequency components of the carrier signals, which are then supplied to the harmonic generating elements NE1 and NE2. The harmonic generating elements NE1 and NE2 are arranged to generate the desired harmonic components due to their nonlinear characteristics and to supply the generated harmonic components to the respective harmonic bandpass filters BP1 and BP2 where the desired harmonic components are filtered out and supplied to the respective subsequent variable phase shifters PH1 and PH2, respectively, and variable attenuators A1 and A2, respectively. The function and arrangement of the remaining components shown in FIG. 7 correspond to those of the first example shown in FIG. 3.

The above described fifth example is especially suitable for CDMA (Code Division Multiple Access), WCDMA (Wideband Code Division Multiple Access) or EDGE (Enhanced Data rates over GSM Evolution) applications where the levels of the harmonic components generated in the driver stages DA1 and DA2 are low, since the amplifier stages operate "backed-off", i.e., in the linear region, and where the two carrier signals are required to be coupled off to a high degree.

It is to be pointed out that the linearisation technique described in the preferred embodiment may be applied in any signal processing device of any other wireless communication system, such as EDGE, GPRS (General Packet Radio Service), or UMTS (Universal Mobile Telecommunications System) systems, to thereby reduce IMD products of two carrier signals due to non-linearities of stages or elements of the device. Moreover, the characteristic features of the above four examples may be combined in any suitable manner. The above description of the preferred embodiment and the accompanying drawings are only intended to illustrate the present invention. The preferred embodiment of the invention may vary within the scope of the attached claims.

In summary, the present invention relates to a linearisation method and signal processing device for reducing intermodulation distortions by extracting harmonic components generated from first and second carrier signals with different carrier frequencies, which are input into two first non-linear stages 11 and 12. The harmonic components may be generated by the two first non-linear stages 11 and 12 or by two additional harmonic generating elements NE1 and NE2. The extracted harmonic components are phase and/or amplitude adjusted and mixed with harmonic components generated in a second non-linear stage 4 to thereby reduce harmonic components so as to achieve a linear output waveform. Thus, an intermodulation distortion suppression can be achieved over the entire operating bandwidth, wherein no phase coherency of the two carrier signals is required.

What is claimed is:

1. A method for linearising a signal processing device having two first non-linear stages and a second non-linear stage, said method comprising the steps of:
   a) inputting a first carrier signal and a second carrier signal into said two first non-linear stages separately, said first and second carrier signals having different carrier frequencies;
   b) extracting harmonic components generated from said first and second carrier signals;
   c) controlling the phase and/or amplitude of said extracted harmonic components; and
   d) reducing harmonic components at the output of said second non-linear stage by combining said phase and/or amplitude controlled harmonic components with harmonic components of said first and second carrier signals, generated in said second non-linear stage.

2. A method according to claim 1, wherein said extracting step is performed by individual filtering operations for each harmonic component.

3. A method according to claim 2, wherein the output signals of said two first non-linear stages are split into two main and two coupled paths, and wherein a lowpass filtering operation for filtering fundamental frequencies is performed in said main paths, and a bandpass filtering operation for filtering said harmonic components is performed in said coupled paths.

4. A method according to claim 1, wherein said phase control is performed by a phase shifting operation, and said amplitude control is performed by an attenuation operation.

5. A method according to claim 1, wherein said harmonic components are generated in said two first non-linear stages.

6. A method according to claim 1, wherein said harmonic components are generated by additional harmonic generating devices.

7. A method according to claim 1, wherein said combining step comprises mixing said phase and/or amplitude controlled harmonic components with fundamental frequency components at the input of said second non-linear stage.

8. A method according to claim 1, wherein said combining step comprises mixing said phase and/or amplitude controlled harmonic components with the output signal of said second non-linear stage.

9. A method according to claim 1, wherein said phase and/or amplitude controlling step is individually performed for each one of said extracted harmonic components, and wherein said extracted harmonic components are combined and amplified before said combining step.

10. A method according to claim 1, wherein said harmonic components comprise second and/or third order harmonic components.

11. A method according to claim 1, wherein said signal processing is a two-tone amplification processing in a wireless communication system.

12. A signal processing device for processing a first carrier signal and a second carrier signal having different carrier frequencies, said device comprising:
   a) two first non-linear stages (11, 12; DA1, DA2) to which said first and second carrier signals are input separately;
   b) harmonic extracting means (2; C1, C2, BP1, BP2, BP3, BP4) for extracting harmonic components generated from said first and second carrier signals;
   c) controlling means (21-1, 21-2 to 2n-1, 2n-2; PH1 to PH4, A1 to A4) for individually controlling the phase and/or amplitude of said extracted harmonic components; and
   d) combining means (C3, C4) for combining said phase and/or amplitude controlled harmonic components with harmonic components of a second non-linear stage (4; PA) so as to reduce harmonic components at the output of said signal processing device.

13. A device according to claim 12, wherein said harmonic extracting means comprises splitting means (C1, C2) arranged for splitting the outputs of said two non-linear stages (1; DA1, DA2) into two main paths, through which fundamental frequencies of said first and second carrier signals are passed, and at least two coupled paths, through which said extracted harmonic components are passed to said controlling means.

14. A device according to claim 13, wherein said main paths comprise lowpass filter means (TP1, TP2) for filtering said fundamental frequencies, and said coupled paths comprise bandpass filter means (BP1, BP2, BP3, BP4) for filtering said harmonic components.

15. A device according to claim 13, wherein said coupled paths comprise one path per each extracted harmonic component.

16. A device according to claim 13, wherein each of said coupled paths comprises a variable phase shifter (PH1 to PH4) and a variable attenuator (A1 to A4).

17. A device according to claim 12, wherein said harmonic components are generated in said two first non-linear stages (11, 12; DA1, DA2).

18. A device according to claim 12, further comprising two harmonic generating devices (NE1, NE2) respectively coupled to the outputs of said two first non-linear stages (11, 12; DA1, DA2) and adapted to generate said harmonic components.

19. A device according to claim 18, wherein said harmonic generating devices (NE1, NE2) are respectively coupled to the outputs of said two first non-linear stages (11, 12; DA1, DA2) via respective filter means (TP3, TP4) adapted to filter out fundamental frequency components of said first and second carrier signals.

20. A device according to claim 18, wherein said harmonic generating devices (NE1, NE2) comprise antiparallel diodes or a quad or bridge diode arrangement.

21. A device according to claim 18, wherein said harmonic generating devices (NE1, NE2) comprise ferrites.

22. A device according to claim 12, further comprising combining means (CB1, CB3) for combining an extracted harmonic component of said first carrier signal with an extracted harmonic component of said second carrier signal, and third combining means (CB2) for combining an extracted fundamental frequency component of said first carrier signal with an extracted fundamental frequency component of said second carrier signal, wherein said combined fundamental frequency components are supplied to said second non-linear stage.

23. A device according to claim 12, wherein said two first non-linear stages comprise a balanced driver configuration (DA1, DA2) and said second non-linear stage is a power amplifier (PA) of a GSM system.

* * * * *